US012787550B2

(12) United States Patent
Hwang et al.

(10) Patent No.: US 12,787,550 B2
(45) Date of Patent: Nov. 3, 2026

(54) ORGANIC LIGHT EMITTING DISPLAY DEVICE AND ORGANIC LIGHT EMITTING DISPLAY PANEL

(71) Applicant: LG Display Co., Ltd., Seoul (KR)

(72) Inventors: Seonghwan Hwang, Paju-si (KR); ByeongUk Gang, Paju-si (KR); Eunji Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 973 days.

(21) Appl. No.: 17/975,509

(22) Filed: Oct. 27, 2022

(65) Prior Publication Data

US 2023/0217720 A1 Jul. 6, 2023

(30) Foreign Application Priority Data

Dec. 30, 2021 (KR) ........................ 10-2021-0192617

(51) Int. Cl.
*H10K 59/122* (2023.01)
*H10K 59/38* (2023.01)

(52) U.S. Cl.
CPC ........... *H10K 59/122* (2023.02); *H10K 59/38* (2023.02)

(58) Field of Classification Search
None
See application file for complete search history.

(56) References Cited

U.S. PATENT DOCUMENTS 11,075,253 B2 7/2021 Kong et al.
2013/0207087 A1* 8/2013 Kim .................. H10D 30/6723 438/23
2016/0133681 A1 5/2016 Nam et al.
2017/0170243 A1 6/2017 An et al.
2017/0301743 A1* 10/2017 Yang .................... H10D 64/033
2019/0172884 A1 6/2019 Shim et al.
2019/0355763 A1* 11/2019 Chen ..................... G02F 1/1362
(Continued)

FOREIGN PATENT DOCUMENTS

CN 107293555 A 10/2017
CN 107885004 A 4/2018
CN 108598145 A 9/2018
(Continued)

*Primary Examiner* — Nishath Yasmeen

(74) *Attorney, Agent, or Firm* — Seed Intellectual Property Law Group LLP

(57) ABSTRACT

The present disclosure relates to an organic light emitting display device and an organic light emitting display panel including color filters disposed on a substrate and overlapping an emission area, a first insulating layer disposed on the color filters, a first active layer disposed on the first insulating layer, a gate electrode disposed on an upper surface of the first active layer, a second insulating layer disposed on the first active layer and the gate electrode and comprising a hole exposing a portion of the upper surface of the first active layer, a bank disposed on the second insulating layer and comprising an opening overlapping the hole of the second insulating layer, an organic layer disposed on the portion of the upper surface of the first active layer and the bank, and a cathode electrode disposed on the organic layer, thereby providing the organic light emitting display device and the organic light emitting display panel that are capable of simplifying the process.

19 Claims, 12 Drawing Sheets

(56) References Cited

U.S. PATENT DOCUMENTS

2020/0194518 A1 6/2020 Myung et al.

FOREIGN PATENT DOCUMENTS

| | | | |
|---|---|---|---|
| CN | 111341925 | A | 6/2020 |
| KR | 20160013443 | A | 2/2016 |
| KR | 20170076190 | A | 7/2017 |
| KR | 20170119801 | A | 10/2017 |
| KR | 10-2019-0064004 | A | 6/2019 |
| TW | 201610481 | A | 3/2016 |
| WO | WO 2020047916 | A1 | 3/2020 |

* cited by examiner

ORGANIC LIGHT EMITTING DISPLAY DEVICE AND ORGANIC LIGHT EMITTING DISPLAY PANEL

CROSS-REFERENCE TO RELATED APPLICATION

This application claims the priority benefit of Korea Patent Application No. 10-2021-0192617, filed on Dec. 30, 2021, which is hereby incorporated by reference in its entirety.

BACKGROUND

Technical Field

The present disclosure relates to an organic light emitting display device and an organic light emitting display panel.

Description of the Related Art

Organic light emitting display devices include one or more thin film transistors (TFT), a storage capacitor, and a plurality of lines.

One or more thin film transistors, the capacitor, and one or more lines are sometimes implemented as fine patterns on a substrate included in the organic light emitting display devices, and the display devices can operate based on complicate connections between one or more thin film transistors, at least one capacitor, and one or more lines.

Recently, there are growing needs for organic light emitting display devices with high luminance and high resolution, and to satisfy such needs, it is desirable to implement a structure that can reduce the complexity of the process of the display devices as well as an efficient space arrangement of elements included in the display devices.

BRIEF SUMMARY

The present disclosure relates to an organic light emitting display device and an organic light emitting display panel, wherein at least one of a plurality of active layers disposed in a circuit area is extended to an emission area so that the active layer serves as an anode electrode of an organic light emitting element and the plurality of active layers are disposed on the same layer as a plurality of signal lines, thereby simplifying the process.

The present disclosure relates to the organic light emitting display device and the organic light emitting display panel, wherein a bank is disposed to expose at least a portion of a side surface of the anode electrode of the organic light emitting element, thereby improving the opening ratio.

According to embodiments of the disclosure, there may be provided the organic light emitting display device including the emission area and a non-emission area surrounding the emission area, wherein the organic light emitting display device includes a plurality of color filters that are disposed on a substrate and include a first color filter overlapping the emission area and a second color filter overlapping the non-emission area, a first insulating layer disposed on the color filters, a first active layer disposed on the first insulating layer, a gate electrode disposed on an upper surface of the first active layer, a second insulating layer disposed on the first active layer and the gate electrode, a hole in the second insulation layer that exposes a portion of the upper surface of the first active layer, a bank disposed on the second insulating layer, an opening in the bank that overlaps the hole of the second insulating layer, an organic layer disposed on the portion of the upper surface of the first active layer and the bank, and a cathode electrode disposed on the organic layer.

According to embodiments of the disclosure, there may be provided the organic light emitting display panel including a substrate, a plurality of color filters disposed on the substrate and overlapping the emission area, a first insulating layer disposed on the plurality of color filters, a first active layer disposed on the first insulating layer, a gate electrode disposed on an upper surface of the first active layer, a second insulating layer disposed on the first active layer and the gate electrode, a hole in the second insulating layer that exposes a portion of the upper surface of the first active layer, the bank disposed on the second insulating layer, and an opening overlapping the hole of the second insulating layer, an organic layer disposed on the portion of the upper surface of the first active layer and the bank, and a cathode electrode disposed on the organic layer.

According to embodiments of the disclosure, a display panel includes a substrate, an emission area on the substrate, a non-emission area adjacent the emission area, a first active layer extending continuously from the emission area into the non-emission area, a driving transistor and a light emitting element. The driving transistor includes a channel area of the first active layer in the non-emission area, a gate electrode overlapping the channel area, and a second insulating layer between the gate electrode and the channel area. The light emitting element includes a first electrode in the first active layer in the emission area, an organic layer on the first electrode, and a second electrode on the organic layer.

According to embodiments of the disclosure, there may be provided the organic light emitting display device and the organic light emitting display panel, wherein at least one of the plurality of active layers disposed in the circuit area is extended to the emission area so that the active layer serves as the anode electrode of the organic light emitting element and the plurality of active layers are disposed on the same layer as the plurality of signal lines, thereby simplifying the process.

According to embodiments of the disclosure, there may be provided the organic light emitting display device and the organic light emitting display panel, wherein the bank is disposed to expose at least the portion of the side surface of the anode electrode of the organic light emitting element, thereby improving the opening ratio.

BRIEF DESCRIPTION OF THE SEVERAL VIEWS OF THE DRAWINGS

The above and other technical benefits, features, and advantages of the disclosure will be more clearly understood from the following detailed description, taken in conjunction with the accompanying drawings, in which.

DETAILED DESCRIPTION

Figure 1:
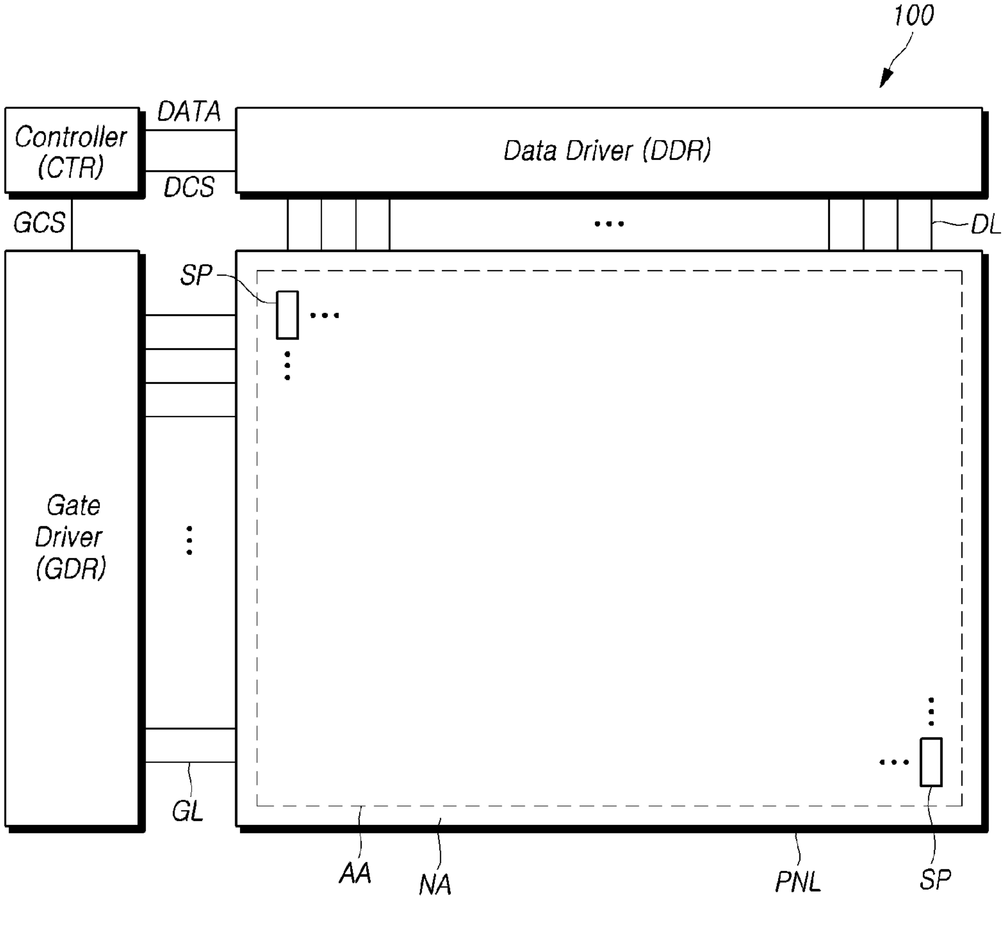
FIG. 1 is a schematic view of a system of an organic light emitting display device according to embodiments of the disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the disclosure rather unclear. The terms such as "including," "having," "containing," "constituting" "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to the accompanying drawings.

FIG. 1 is a schematic view of a system of an organic light emitting display device according to embodiments of the disclosure.

The organic light emitting display device 100 according to embodiments of the disclosure may include the organic light emitting display panel PNL, a lighting device, a light emitting device, and the like. Hereinafter, for convenience of description, the organic light emitting display device 100 will be mainly described. However, so long as a transistor(s) is included, the same may be applied to other various organic light emitting display devices 100 such as a lighting device and a light emitting device, as well as the organic light emitting display device 100.

The organic light emitting display device 100 according to embodiments of the disclosure may include a display panel PNL for displaying an image or outputting light, and a driving circuit for driving the display panel PNL.

Furthermore, the organic light emitting display device 100 according to embodiments of the disclosure may be a bottom emission type of organic light emitting display device in which light is emitted in a direction toward a substrate on which a light emitting element is disposed, although not limited thereto. In some cases, the organic light emitting display device 100 of the disclosure may be of a top emission type in which light is emitted to a surface opposite to the substrate on which the light emitting element is disposed, or of a double-sided emission type in which light emitted from the light emitting element is emitted in the direction toward the substrate and to the surface opposite to the substrate.

A plurality of data lines DL and a plurality of gate lines GL may be disposed on the display panel PNL. In addition, in the display panel PNL, a plurality of sub-pixels SP positioned at regions of overlap of the plurality of data lines DL and the plurality of gate lines GL may be arranged in a matrix type.

In the display panel PNL, the plurality of data lines DL and the plurality of gate lines GL may be disposed to cross each other. For example, the plurality of gate lines GL may be arranged in rows or columns, and the plurality of data lines DL may be arranged in columns or rows. Hereinafter, for convenience of description, it is assumed that the plurality of gate lines GL are arranged in rows and the plurality of data lines DL are arranged in columns.

In addition to the plurality of data lines DL and the plurality of gate lines GL, other types of signal lines may be arranged in the display panel PNL depending on a sub-pixel structure, etc. A driving power line, a reference power line, or a common power line, etc., may be further arranged in the display panel PNL.

The types of signal lines arranged in the display panel PNL may vary depending on the sub-pixel structure, etc. In addition, throughout this specification, the signal lines may be of a concept containing electrodes to which a signal is applied.

The display panel PNL may include an active area AA on which an image (picture) is displayed and a non-active area NA, outside the active area, on which no image is displayed. Here, the non-active area NA may also be referred to as a bezel area.

The plurality of sub-pixels SP for displaying an image may be disposed in the active area AA.

In the non-active area NA may be disposed a pad portion for electrically connecting a data driver DDR, and a plurality of data link lines may disposed in the non-active area NA to connect the pad portion and the plurality of data lines DL. Here, the plurality of data link lines may be portions in which the plurality of data lines DL extend to the non-active area NA or separate patterns electrically connected to the plurality of data lines DL.

Furthermore, in the non-active area NA may be disposed gate driving-related wirings for transmitting a voltage (signal) beneficial for gate driving to a gate driver GDR through the pad portion to which the data driver DDR is electrically connected. For example, the gate driving-related wirings may include clock wirings for transmitting a clock signal, gate power lines that transmit gate voltages (VGH, VGL), gate driving control signal wirings for transmitting various control signals beneficial to generate a scan signal, etc. These gate driving-related wirings may be disposed in the non-active area NA, unlike the gate lines GL disposed in the active area AA.

The driving circuit may include the data driver DDR for driving the plurality of data lines DL, the gate driver GDR for driving the plurality of gate lines GL, a controller CTR for controlling the data driver DDR and the gate driver GDR, and so on.

The data driver DDR may serve to drive the plurality of data lines DL by outputting a data voltage to the plurality of data lines DL.

The gate driver GDR may serve to drive the plurality of gate lines GL by outputting a scan signal to the plurality of gate lines GL.

The controller CTR may supply various control signals DCS and GCS beneficial for driving operations of the data driver DDR and the gate driver GDR to control the driving operations of the data driver DDR and the gate driver GDR. In addition, the controller CTR may supply an image data DATA to the data driver DDR.

The controller CTR may operate to start scanning according to the timing implemented in each frame. The controller CTR may convert the image data input from the outside complying to a data signal format used by the data driver (DDR) to output the converted image data DATA, and control the data driving at an appropriate timing point in compliance with the scanning.

In order to control the data driver DDR and the gate driver GDR, the controller CTR may receive timing signals such as a vertical synchronization signal Vsync, a horizontal synchronization signal Hsync, an input data enable (DE) signal, a clock signal CLK from an external device (e.g., a host system) to generate various control signals to be output to the data driver DDR and the gate driver GDR.

For example, in order to control the gate driver GDR, the controller CTR may output various gate control signals GCS including a gate start pulse (GSP), a gate shift clock (GSC), a gate output enable signal (GOE), and the like.

Furthermore, in order to control the data driver DDR, the controller CTR may output various data control signals DCS including a source start pulse (SSP), a source sampling clock (SSC), a source output enable signal (SOE), and so on.

The controller CTR may be a timing controller used in a conventional display technology or a controller capable of further performing other control functions including the timing controller.

The controller CTR may be implemented as a separate component from the data driver DDR, or may be implemented as an integrated circuit with the data driver DDR.

The data driver DDR may receive the image data DATA from the controller CTR and supply a data voltage to the plurality of data lines DL to drive the plurality of data lines DL. Here, the data driver DDR may be also referred to as a source driver.

The data driver (DDR) may exchange various signals with the controller CTR through various interfaces.

The gate driver GDR may sequentially supply scan signals to the plurality of gate lines GL to drive the plurality of gate lines GL in sequence. Here, the gate driver GDR may be also referred to as a scan driver.

The gate driver GDR may sequentially supply a scan signal of an on/off voltage to the plurality of gate lines GL under the control of the controller CTR.

When a specific gate line is opened by the gate driver GDR, the data driver DDR may convert the image data DATA received from the controller CTR into an analog data voltage to be supplied to the plurality of data lines DL.

The data driver DDR may be located on only one side (e.g., either a top or bottom side) of the display panel PNL, but the disclosure is not limited thereto. For example, it may be located on both sides (e.g., both top and bottom sides) of the display panel PNL, depending on a driving method, a display panel design method, etc.

The gate driver GDR may be located on only one side (e.g., either a left or right side) of the display panel PNL, but the disclosure is not limited thereto. For example, it may be located on both sides (e.g., both left and right sides) of the display panel PNL, depending on a driving method, a display panel design method, etc.

The data driver DDR may be implemented with at least one source driver integrated circuit SDIC.

Each source driver integrated circuit SDIC may include a shift register, a latch circuit, a digital-to-analog converter (DAC), an output buffer, and the like. In some cases, the data driver DDR may further include at least one analog-to-digital converter (ADC).

Each source driver integrated circuit SDIC may be connected to a bonding pad of the display panel PNL in either a tape automated bonding (TAB) type or a chip-on-glass (COG) type, or may be placed directly onto the display panel PNL. In some cases, each source driver integrated circuit SDIC may be integrated with the display panel PNL and disposed therein. Furthermore, each source driver integrated circuit SDIC may be implemented in a chip-on-film (COF) type. In this case, each source driver integrated circuit SDIC may be mounted on a circuit film to be electrically connected to the data lines DL of the display panel PNL through the circuit film.

The gate driver GDR may include a plurality of gate driving circuits GDC. Here, the plurality of gate driving circuits GDC may respectively correspond to the plurality of gate lines GL.

Each gate driving circuit GDC may include a shift register, a level shifter, and the like.

Each gate driving circuit GDC may be connected to the bonding pad of the display panel PNL in either a tape automated bonding (TAB) type or a chip-on-glass (COG) type. In addition, each gate driving circuit GDC may be implemented in a chip-on-film (COF) type. In this case, each gate driving circuit GDC may be mounted on a circuit film to be electrically connected to the gate lines GL of the display panel PNL through the circuit film. Furthermore, each gate driving circuit GDC may be implemented in a gate-in-panel (GIP) type to be embedded in the display panel PNL. That is, each gate driving circuit GDC may be formed directly in the display panel PNL.

Figure 2:
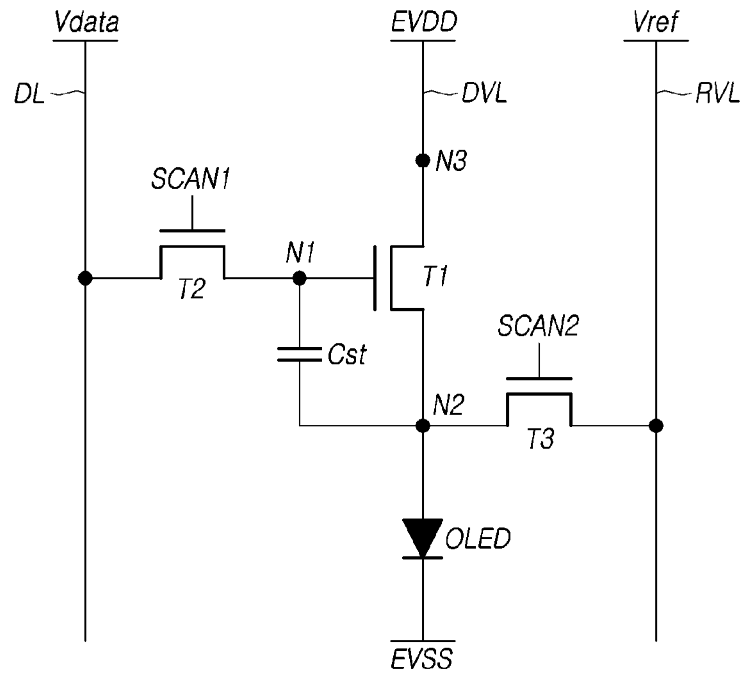
FIG. 2 is a view of a sub-pixel structure when an organic light emitting display panel including organic light emitting diodes (OLED) is employed in the display device according to embodiments of the disclosure.

FIG. 2 illustrates a sub-pixel SP structure when an organic light emitting display panel PNL including an organic light emitting element such as an organic light emitting diodes (OLED) is employed in the display device according to embodiments of the disclosure.

Referring to FIG. 2, each sub-pixel SP in the organic light emitting display panel PNL including the organic light emitting element may include a second transistor T2 passing a data voltage Vdata to a first node N1 corresponding to a gate node of a driving transistor T1, and a storage capacitor Cst for maintaining the data voltage Vdata corresponding to an image signal voltage or a voltage corresponding thereto during one frame time.

The organic light emitting element OLED may include a first electrode (an anode electrode or a cathode electrode), an organic layer including at least one emission layer, and a second electrode (the cathode electrode or the anode electrode), etc.

In one embodiment, a base voltage EVSS may be applied to the second electrode of the organic light emitting element OLED.

The driving transistor T1 can drive the organic light emitting element OLED by supplying a driving current to the organic light emitting element OLED.

The driving transistor T1 may have the first node N1, a second node N2, and a third node N3.

The "node" of the first to third nodes N1, N2, and N3 may denote a point, one or more electrodes, or one or more lines, which have the same electrical state.

Each of the first node N1, the second node N2, and the third node N3 may be made up of one or more electrodes.

The first node N1 of the driving transistor T1 may be a node corresponding to the gate node thereof, and may be electrically connected to a source node or a drain node of the second transistor T2.

The second node N2 of the driving transistor T1 may be electrically connected to the first electrode of the organic light emitting element OLED and may be a source node or a drain node.

The third node N3 of the driving transistor T1 may be the drain node or the source node as a node to which a driving voltage EVDD is applied, and may be electrically connected to a driving voltage line DVL for passing the driving voltage EVDD.

The driving transistor T1 and the second transistor T2 may be n-type transistors or p-type transistors.

The second transistor T2 may be electrically connected between a data line DL and the first node N1 of the driving transistor T1, and may be controlled by a first scan signal SCAN1 that is delivered through a gate line and applied to the gate node of the second transistor T2.

The second transistor T2 may be turned on by the first scan signal SCAN1 and apply a data voltage Vdata passed through the data line DL to the first node N1 of the driving transistor T1.

The storage capacitor Cst may be electrically connected between the first node N1 and the second node N2 of the driving transistor T1.

The storage capacitor Cst is an external capacitor intentionally designed to be located outside of the driving transistor T1, other than an internal storage, such as a parasitic capacitor (e.g., a Cgs and a Cgd) that presents between the first node N1 and the second node N2 of the driving transistor T1.

A third transistor T3 may be electrically connected between the second node N2 of the driving transistor T1 and a reference voltage line RVL. On/off operations of the third transistor T3 may be controlled by a second scan signal SCAN2 applied to the gate node of the third transistor T3.

A drain node or a source node of the third transistor T3 may be electrically connected to the reference voltage line RVL, and may be electrically connected to the second node N2 of the driving transistor T1.

The third transistor T3, for example, may be turned on in a period in which display driving is performed, and turned on in a period in which sensing driving is performed for sensing a characteristic value of the driving transistor T1 or a characteristic value of the organic light emitting diode (OLED).

The third transistor T3 may be turned on by the second scan signal SCAN2 and pass a reference voltage Vref applied to the reference voltage line RVL to the second node N2 of the driving transistor T1, according to corresponding driving timings (e.g., a display driving timing or an initial timing within a time period for the sensing driving).

The third transistor T3 may be turned on by the second scan signal SCAN2 and pass a voltage at the second node N2 of the driving transistor T1 to the reference voltage line RVL, according to corresponding driving timings (e.g., a sampling timing within the time period for the sensing driving).

In other words, the third transistor T3 can control a voltage status at the second node N2 of the driving transistor T1, or pass the voltage at the second node N2 of the driving transistor T1 to the reference voltage line RVL.

The reference voltage line RVL may be electrically connected to an analog-to-digital converter that senses a voltage of the reference voltage line RVL, converts the sensed voltage to a digital value, and then, outputs sensing data including the digital value.

The analog-to-digital converter may be included in the source driver integrated circuit SDIC implementing the data driving circuit DDR.

The sensing data output from the analog-to-digital converter may be used to sense a characteristic value of the driving transistor T1 (e.g., a threshold voltage, mobility, etc.) or a characteristic value of the organic light emitting diode (OLED) (e.g., a threshold voltage, etc.).

Each of the driving transistor T1, the second transistor T2, and the third transistor T3 may be an n-type transistor or a p-type transistor.

Meanwhile, the first scan signal SCAN1 and the second scan signal SCAN2 may be separate gate signals. In this instance, the first scan signal SCAN1 and the second scan signal SCAN2 respectively may be applied to the gate node of the second transistor T2 and the gate node of the third transistor T3 through different gate lines.

In some embodiments, the first scan signal SCAN1 and the second scan signal SCAN2 may be the same gate signal. In this instance, the first scan signal SCAN1 and the second scan signal SCAN2 may be commonly applied to the gate node of the second transistor T2 and the gate node of the third transistor T3 through the same gate line.

Each sub-pixel structure shown in FIG. 2 is merely one example of possible sub-pixel structures for convenience of description, and the sub-pixel may further include at least one transistor or, in some cases, at least one storage capacitor.

In some embodiments, each of a plurality of sub-pixels may have the same structure, or some of the plurality of sub-pixels may have a different structure.

Figure 3:
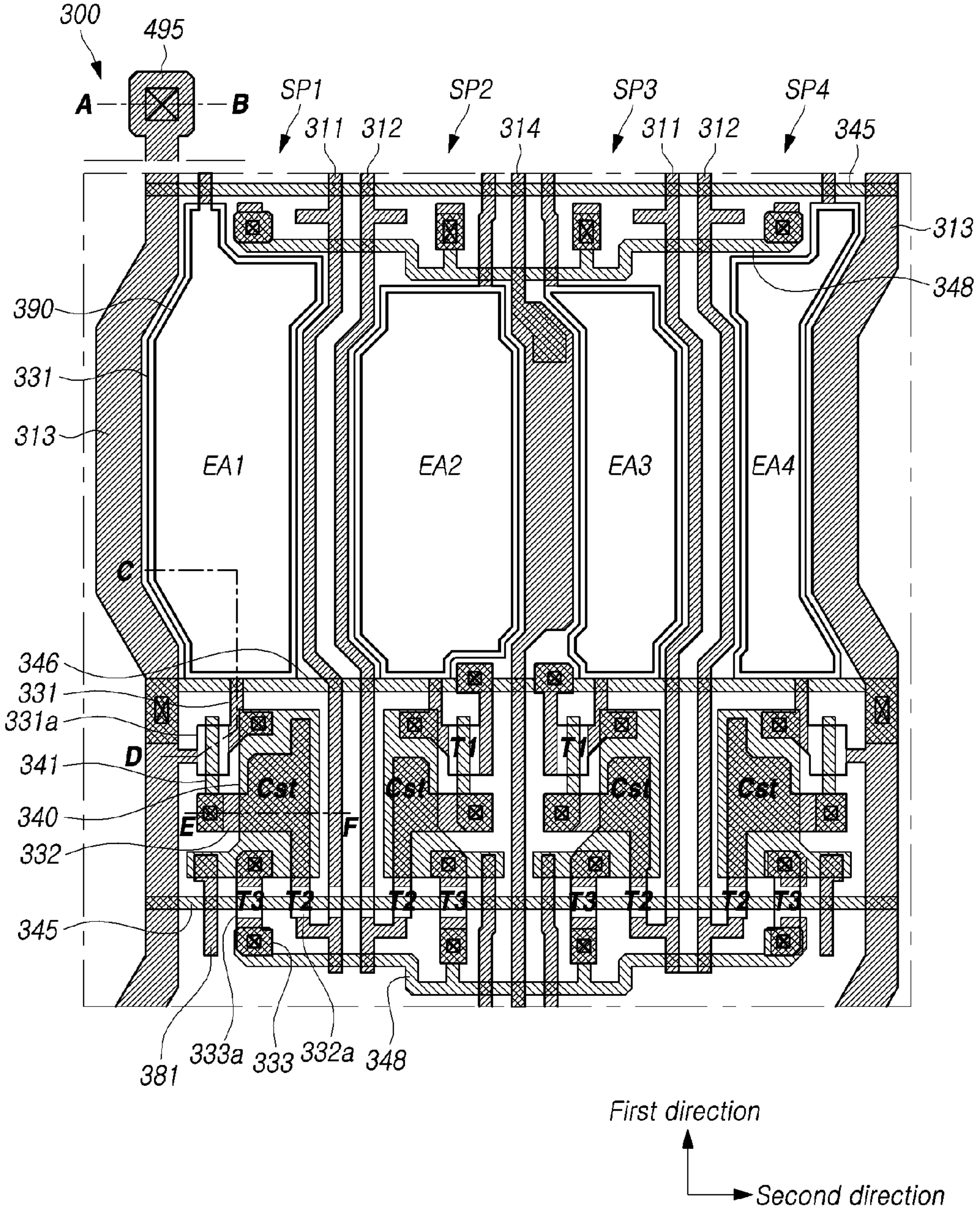
FIG. 3 is a top plan view of some areas of the organic light emitting display device according to embodiments of the disclosure.
Figure 4:
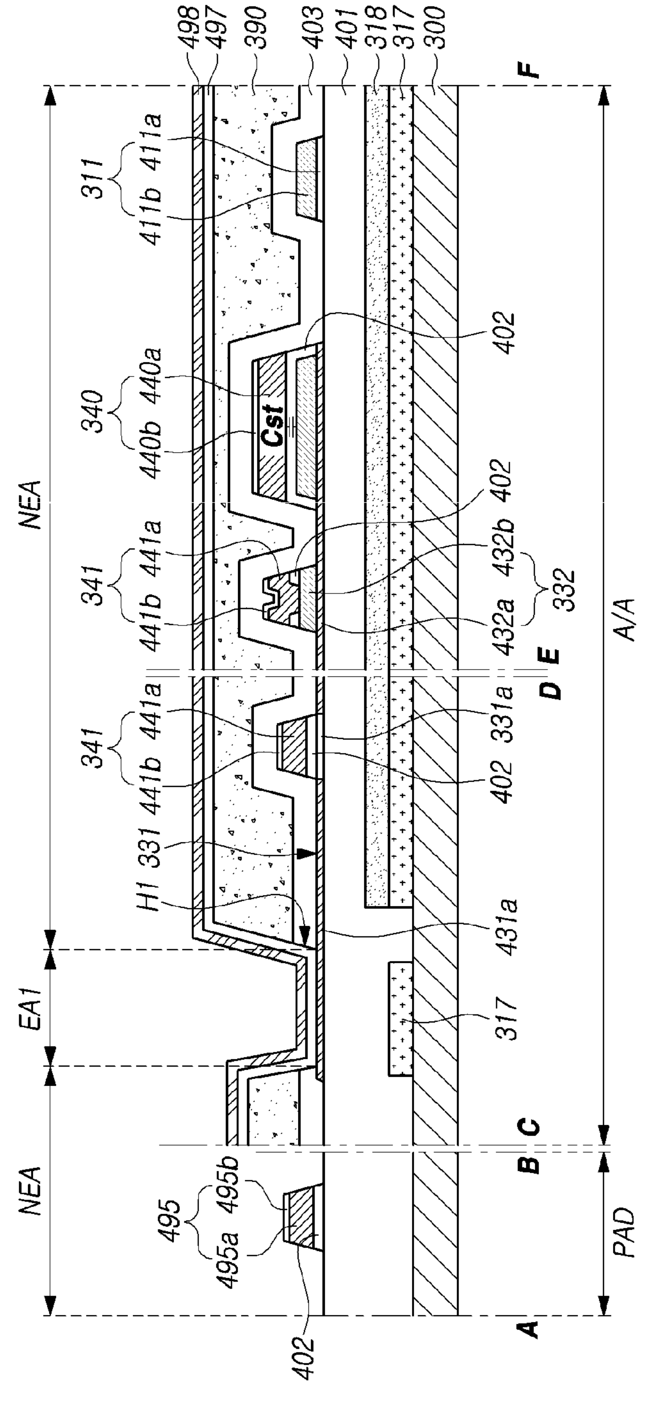
FIG. 4 is a cross-sectional view taken along the lines A-B, C-D, and E-F in FIG. 3.

FIG. 3 is a top plan view of some areas of an organic light emitting display device according to embodiments of the disclosure. FIG. 4 is a cross-sectional view taken along the lines A-B, C-D, and E-F in FIG. 3.

Referring to FIGS. 3 and 4, the organic light emitting display device 100 according to embodiments of the disclosure may include an active area in which a plurality of sub-pixels are disposed and a non-active area in which a plurality of pad electrodes 495 are disposed.

The plurality of sub-pixels may include first, second, third and fourth sub-pixels SP1, SP2, SP3, and SP4.

The first sub-pixel SP1 may include a first emission area EA1 emitting red light, the second sub-pixel SP2 may include a second emission area EA2 emitting white light, the third sub-pixel SP3 may include a third emission area EA3 emitting blue light, and the fourth sub-pixel SP4 may include a fourth emission area EA4 emitting green light, but embodiments of the disclosure are not limited thereto.

The sub-pixels SP1, SP2, SP3, and SP4 may include the emission areas EA1, EA2, EA3, and EA4 divided by a bank 390, respectively, and a non-emission area NEA.

The first, second, third and fourth emission areas EA1, EA2, EA3, and EA4 may not overlap the bank 390, and the non-emission area may overlap the bank 390.

An organic light emitting element OLED including a first electrode, an organic layer 497, and a second electrode 498 may be disposed in the emission area EA. A color filter 317 may be disposed in an area overlapping the organic light emitting element OLED, but the disclosure is not limited thereto. For example, the color filter may be disposed only in some sub-pixels among the plurality of sub-pixels included in the organic light emitting display device 100, or may not be disposed in all of the plurality of sub-pixels included therein.

For example, a first color filter 317 may be disposed in the first sub-pixel SP1 to overlap the first emission area EA1, a second color filter 318 may be disposed in the third sub-pixel SP3 to overlap the third emission area EA3, and a third color filter 319 may be disposed in the fourth sub-pixel SP4 to overlap the fourth emission area EA4.

No color filter may be disposed in the second emission area EA2, but the structure of the organic light emitting display device according to embodiments of the disclosure is not limited thereto.

A circuit area for driving the organic light emitting element OLED may be provided in the non-emission area NEA.

A plurality of signal lines, a plurality of transistors, and a storage capacitor Cst may be disposed in the circuit area.

Referring to FIG. 4, specifically, the plurality of color filters 317 and 318 may be disposed on a substrate 300.

As shown in FIG. 4, a first color filter part of the first color filter 317 may be disposed at a position corresponding to the first emission area EA1.

A second color filter part of the first color filter 317 may be disposed in the non-emission area NEA while being spaced apart from the first color filter part of the first color filter 317 disposed to correspond to the first emission area EA1, and the second color filter 318 may be disposed on the first color filter 317.

The first color filter 317 and the second color filter 318 stacked on the substrate 300 may overlap the circuit area of the sub-pixels.

The first color filter 317 may be a red color filter and the second color filter 318 may be a blue color filter, but the colors of the color filters according to embodiments of the disclosure are not limited thereto. It is sufficient if the colors of the first color filter 317 and the second color filter 318 disposed in the non-emission area NEA are different from each other.

Specifically, a first signal line 311, a second signal line 312, a third signal line 313, a fourth signal line 314, and a first conductive layer 315 may be disposed on the substrate 300.

Referring to FIG. 4, a first insulating layer 401 may be disposed on the substrate 300 on which the first and second color filters 317 and 318 are disposed.

The first insulating layer 401 may include an organic insulating material, and may be disposed on the substrate 300 to have a flat surface.

Referring to FIGS. 3 and 4, a plurality of active layers 331, 332, and 333 may be disposed on the first insulating layer 401.

Referring to FIGS. 3 and 4, specifically, the first active layer 331, the second active layer 332, and the third active layer 333 may be disposed on the first insulating layer 401.

Each of the sub-pixels SP1, SP2, SP3, and SP4 may include the first to third active layers 331, 332, and 333.

Referring to FIGS. 3 and 4, the second active layer 332 and the third active layer 333 spaced apart from the first active layer 331 may be disposed on the substrate 300.

The first active layer 331 may be an active layer of a first transistor T1.

The second active layer 332 may be an active layer of a second transistor T2.

The third active layer 333 may be an active layer of a third transistor T3.

Referring to FIGS. 3 and 4, the first to third active layers 331, 332, and 333 may be formed as a single layer in some areas, and may be formed as a double layer in the other areas.

The first to third active layers 331, 332, and 333 may respectively include a first active pattern and a second active pattern disposed on the first active pattern in an area in contact with other components through a contact hole.

For example, as shown in FIG. 4, the second active layer 332 may comprise the first active pattern 432*a* and the second active pattern 432*b* disposed on the first active pattern 432*a*.

The first active pattern 432*a* may be formed of an oxide semiconductor.

A metal oxide semiconductor may be the material of which the first active pattern 432*a* is made. That is, the first active pattern 432*a* may be made of oxides of metals such as molybdenum (Mo), zinc (Zn), indium (In), gallium (Ga), tin (Sn), and titanium (Ti) or combinations of the metals and the oxides thereof.

For example, the first active pattern 432*a* may include at least one of transparent conductive materials such as zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO), but the disclosure is not limited thereto.

The metal layer of the second active pattern 432*b* may include any one of metals such as aluminum (Al), gold (Au), silver (Ag), copper (Cu), tungsten (W), molybdenum (Mo), chromium (Cr), tantalum (Ta), and titanium (Ti) or alloys thereof. For example, the metal layer may be an alloy of molybdenum (Mo) and titanium (Ti), but the disclosure is not limited thereto.

The first and third active layers 331 and 333 may also include the first active pattern and the second active pattern disposed on the first active pattern, as does the second active layer 332.

The first to third active layers 331, 332, and 333 may respectively include a channel area 331*a*, 332*a*, and 333*a*.

To be specific, the first active layer 331 may include the first channel area 331*a*, the second active layer 332 may include the second channel area 332*a*, and the third active layer 333 may include the third channel area 333*a*.

The first channel area 331*a* may be a channel area of the first transistor T1, the second channel area 332*a* may be a channel area of the second transistor T2, and the third channel area 333*a* may be a channel area of the third transistor T3.

Only the first active pattern 431*a* of the first to third active layers 331, 332, and 333 may be disposed in the first to third channel areas 331*a*, 332*a*, and 333*a*.

At least some of areas other than the first to third channel areas 331*a*, 332*a*, and 333*a* of the first active pattern 431*a* of each of the first to third active layers 331, 332, and 333 may be conductive.

In other words, in the first to third channel areas 331*a*, 332*a*, and 333*a* of the first active pattern 431*a* of each of the first to third active layers 331, 332, and 333, the first active pattern 431*a* may not be conductive. It should be understood that "not be conductive" or "non-conductive" includes the meaning of semiconductive. For example, the first to third channel areas 331*a*, 332*a*, 333*a* may not conduct electrical current in an unbiased or reverse-biased state, and may conduct electrical current in a forward-biased state, such as when an electrical voltage greater than a threshold voltage of the first to third channel areas 331*a*, 332*a*, 333*a* is applied thereto. The first active pattern 431*a* being "conductive" includes the meaning that an electrical current flows through the first active pattern 431*a* in the presence of an electrical bias, even when the electrical bias is below the threshold voltage.

As mentioned above, the second active pattern 431*b* may be disposed in at least some of the areas other than the first to third channel areas 331*a*, 332*a*, and 333*a* of the first to third active layers 331, 332, and 333.

The areas in which the first to third active layers 331, 332, and 333 are connected to other components through the contact holes may serve as source and drain electrodes of the first to third transistors T1, T2, and T3.

As shown in FIGS. 3 and 4, in each of the sub-pixels SP1, SP2, SP3, and SP4, the first active layer 331 may be disposed to be extended not only to the non-emission area NEA but also to the emission areas EA1, EA2, EA3, and EA4.

Specifically, the first active layer 331 disposed in the circuit area of each of the sub-pixels SP1, SP2, SP3, and SP4 may be disposed to be extended not only to the emission areas EA1, EA2, EA3, and EA4 of the sub-pixels but also to a portion of the non-emission area NEA surrounding the emission areas.

Only the first active pattern 431*a* may be disposed on the first active layer 331 in the emission areas EA1, EA2, EA3, and EA4 and the portion of the non-emission area NEA surrounding the emission areas of the sub-pixels SP1, SP2, SP3, and SP4.

An area where the first active layer 331 is disposed in the emission areas EA1, EA2, EA3, and EA4 and the portion of the non-emission area NEA surrounding the emission areas of the sub-pixels SP1, SP2, SP3, and SP4 may serve as a first electrode (e.g., an anode electrode) of the organic light emitting element OLED.

Referring to FIGS. 3 and 4, the plurality of signal lines 311, 312, 313, and 314 may be disposed on the same layer as the first to third active layers 331, 332, and 333 and comprise the same material as the first to third active layers 331, 332, and 333.

The plurality of signal lines 311, 312, 313, and 314 may include the first, second, third and fourth signal lines 311, 312, 313, and 314.

The first to fourth signal lines 311, 312, 313, and 314 may be spaced apart from one another and extended in a first direction (e.g., a vertical direction). It should be understood that "extended in a first direction" includes the meaning of extending fully straight in the first direction and extending generally in the first direction (e.g., inclusive of bends or detours). For example, as shown in FIG. 3, the first signal line 311 adjacent the first emission area EA1 generally extends in the first direction, and includes a section that bends toward the first emission area EA1 and away from the second emission area EA2. As such, the first signal line 311, while not extending fully straight in the first direction for its entire length, is considered to be "extended in the first direction." Another term for this is "extending in a substantially vertical direction."

Here, the first and second signal lines 311 and 312 may be data lines, the third signal line 313 may be a driving voltage line, and the fourth signal line 314 may be a reference voltage line, but the disclosure is not limited thereto.

At least one of the first to fourth signal lines 311, 312, 313, and 314 may have a structure in which the first active pattern and the second active pattern disposed on the first active pattern are disposed.

For example, as shown in FIG. 4, the first signal line 311 may include the first active pattern 411*a* disposed on the first insulating layer 401 and the second active pattern 411*b* disposed on the first active pattern 411*a*.

The second to fourth signal lines 312, 313, and 314 may also include the first active pattern 411*a* and the second active pattern 411*b*.

When the first to fourth signal lines 311, 312, 313, and 314 include only the first active pattern 411*a*, the oxide semiconductor of the first active pattern 411*a* of the first to fourth signal lines 311, 312, 313, and 314 may be conductive.

Referring to FIG. 3, the first active layer 331 disposed on the first sub-pixel SP1 may be integrated with the third signal line 313, and the second active layer 332 disposed thereon may be integrated with the first signal line 311.

The second active layer 332 disposed on the second sub-pixel SP2 may be integrated with the second signal line 312.

The second active layer 332 disposed on the third sub-pixel SP3 may be integrated with the first signal line 311, and may be a line other than the first signal line 311 integrated with the second active layer 332 of the first sub-pixel SP1.

The first active layer 331 disposed on the fourth sub-pixel SP4 may be integrated with the third signal line 313, and may be a line other than the third signal line 313 integrated with the first active layer 331 of the first sub-pixel SP1.

The second active layer 332 disposed on the fourth sub-pixel SP4 may be integrated with the second signal line 312, and may be a line other than the second signal line 312 integrated with the second active layer 332 of the second sub-pixel SP2.

As shown in FIG. 3, the plurality of sub-pixels SP1, SP2, SP3, and SP4 may respectively include a repair pattern 381 disposed between one of the first to fourth signal lines 311, 312, 313, and 314 and the third active layer 333.

It may possible that the electrical connection between the first active layer 331 extending to the emission area and the circuit area is disconnected by means of a laser, etc., when defects such as bright or dark spots occur in the sub-pixels.

Thereafter, the repair pattern 381 may be electrically connected to a plate 340 through a welding process. For example, the repair pattern 381 and the plate 340 disposed on the repair pattern 381 may contact each other.

Although not shown in FIG. 3, the repair pattern 381 may be electrically connected to the circuit area of another adjacent sub-pixel, and a defective sub-pixel may be driven through an adjacent circuit area electrically connected to the repair pattern 381.

As described above, the first to third active layers 331, 332, and 333, the first to fourth signal lines 311, 312, 313, and 314, and the repair pattern 381 may be disposed on the same layer and formed by the same process, thereby simplifying the process of manufacturing the organic light emitting display device.

When the first to third active layers 331, 332, and 333, the first to fourth signal lines 311, 312, 313, and 314, and the repair pattern 381 are manufactured by different processes, a mask is used for each process. However, in the case of using the organic light emitting display device according to embodiments of the disclosure, it may be possible that the first to third active layers 331, 332, and 333 and the first to fourth signal lines 311, 312, 313, and 314 are simultaneously formed with a single mask, thereby reducing the number of masks used.

A second insulating layer 402 may be disposed on a portion of an upper surface of each of the first to third active layers 331, 332, and 333, the first to fourth signal lines 311, 312, 313, and 314, and the repair pattern 381.

The second insulating layer 402 may include an inorganic insulating material such as silicon oxide (SiOx), silicon nitride (SiNx), or silicon oxynitride (SiON), but embodiments of the disclosure are not limited thereto.

The second insulating layer 402 may be a gate insulating layer, but embodiments of the disclosure are not limited thereto.

A fifth signal line 345, a first extension 346, a second extension 348, the plate 340, and a first electrode pattern 341 may be disposed on the second insulating layer 402.

Here, the fifth signal line 345 may be a scan line extending in a second direction (e.g., a horizontal direction) crossing the first direction.

As shown in FIG. 3, a portion of the fifth signal line 345 may overlap a portion of each of the second and third active layers 332 and 333.

The fifth signal line 345 may serve as a gate electrode of each of the second transistor T2 and the third transistor T3.

An area where the second active layer 332 or the third active layer 333 overlaps the fifth signal line 345 and the second insulating layer 402 may be the channel area of the second active layer 332 or the third active layer 333.

The first extension 346 may be electrically connected to the third signal line 313. The plurality of sub-pixels SP1, SP2, SP3, and SP4 may receive a driving voltage through the first extension 346.

The second extension 348 may be electrically connected to the fourth signal line 314. The plurality of sub-pixels SP1, SP2, SP3, and SP4 may receive a reference voltage through the second extension 348.

As shown in FIG. 3, a portion of the plate 340 in each of the sub-pixels SP1, SP2, SP3, and SP4 may overlap a portion of each of the first to third active layers 331, 332, and 332.

The first active layer 331 may be in contact with the plate 340 through the contact hole, and may be electrically connected thereto.

The third active layer 333 may also be in contact with the plate 340 through the contact hole, and may be electrically connected thereto.

As shown in FIGS. 3 and 4, the second active layer 332 may overlap the plate 340 to form a storage capacitor Cst. In other words, the second active layer 332 and the plate 340 may serve as electrodes of the storage capacitor Cst.

A portion of the first electrode pattern 341 may overlap a portion of the first active layer 331.

The first electrode pattern 341 may serve as the gate electrode of the driving transistor T1.

As shown in FIGS. 3 and 4, an area in which the first active layer 331 overlaps the first electrode pattern 341 and the second insulating layer 402 may be the channel area 331*a* of the first active layer 331.

As shown in FIG. 3, the first electrode pattern 341 may be in contact with the second active layer 332 through the contact hole, and may be electrically connected thereto.

Referring to FIGS. 3 and 4, at least one pad electrode 495 may be disposed in a pad area PAD of the organic light emitting display device according to embodiments of the disclosure.

The pad electrode 495 may be disposed on the second insulating layer 402 in the pad area PAD.

The fifth signal line 345, the first extension 346, the second extension 348, the plate 340, the first electrode pattern 341, and the pad electrode 495 may have a multi-layered structure.

For example, the fifth signal line 345, the first extension 346, the second extension 348, the plate 340, the first electrode pattern 341, and the pad electrode 495 may respectively include a first conductive layer 411*a*, 440*a*, 441*a*, and 495*a* disposed on the second insulating layer 402 and a second conductive layer 411*b*, 440*b*, 441*b*, and 495*b* disposed on the first conductive layer.

The first conductive layer 411*a*, 440*a*, 446*a*, and 495*a* may include any one of metals such as aluminum (Al), gold (Au), silver (Ag), copper (Cu), tungsten (W), molybdenum (Mo), chromium (Cr)), tantalum (Ta), and titanium (Ti) or alloys thereof, but embodiments of the disclosure are not limited thereto.

The second conductive layer 411*b*, 440*b*, 441*b*, and 445*b* may include any one of Indium Tin Oxide (ITO), Indium Zinc Oxide (IZO), and Indium Gallium Zinc Oxide (IGZO), but embodiments of the disclosure are not limited thereto.

The structure of the organic light emitting display device 100 according to embodiments of the disclosure is not limited thereto. The pad electrode 495 disposed in a non-active area may have a stack of multiple layers, and the fifth signal line 345, the first extension 346, the second extension 348, the plate 340, and the first electrode pattern 341 disposed in an active area may have a single layer made of only the first conductive layer.

The second conductive layer 495*b* included in the pad electrode 495 may serve to prevent oxidation of the first conductive layer 495*a*.

FIG. 4 shows a structure where the second conductive layer 411*b*, 440*b*, 441*b*, and 495*b* is disposed only on the upper surface of the first conductive layer 411*a*, 440*a*, 446*a*, and 495*a*, but the second conductive layer may be positioned to surround the upper and side surfaces of the first conductive layer.

As described above, the fifth signal line 345, the first extension 346, the second extension 348, the plate 340, the first electrode pattern 341, and the pad electrode 495 may be disposed on the same layer and formed by the same process, thereby simplifying the process of manufacturing the organic light emitting display device.

When the fifth signal line 345, the first extension 346, the second extension 348, the plate 340, the first electrode pattern 341, and the pad electrode 495 are manufactured by different processes, a mask is used for each process. However, in the case of using the organic light emitting display device according to embodiments of the disclosure, it may be possible that the fifth signal line 345, the first extension 346, the second extension 348, the plate 340, the first electrode pattern 341, and the pad electrode 495 are simultaneously formed with a single mask, thereby reducing the number of masks used.

As shown in FIG. 4, a third insulating layer 403 may be disposed on the substrate 300 on which the fifth signal line 345, the first extension 346, the second extension 348, the plate 340, the first electrode pattern 341, and the pad electrode 495 are disposed.

The third insulating layer 403 may include the inorganic insulating material such as silicon oxide (SiOx), silicon nitride (SiNx), or silicon oxynitride (SiON), but embodiments of the disclosure are limited thereto.

As shown in FIGS. 3 and 4, the third insulating layer 403 may include a first hole H1 exposing a portion of an upper surface of the first active layer 331.

The bank 390 may be disposed on the third insulating layer 403.

The bank 390 may have an opening in each of the sub-pixels SP1, SP2, SP3, and SP4, and the opening may overlap the first hole H1 of the third insulating layer 403.

As shown in FIG. 4, only the conductive first active pattern 431*a* may be disposed on the first active layer 331 exposed by the opening of the bank 390 and the first hole H1 of the third insulating layer 403.

The conductive first active pattern 431*a* on the first active layer 331 exposed by the opening of the bank 390 and the first hole H1 of the third insulating layer 403 may serve as the first electrode (e.g., the anode electrode) of the organic light emitting element OLED.

The organic layer 497 of the organic light emitting element OLED may be disposed in the opening of the bank 390 and the first hole H1 of the third insulating layer 403 and on the bank 390. The organic layer 497 may include an emission layer.

The second electrode 498 of the organic light emitting element OLED may be disposed on the organic layer 497.

Meanwhile, the first color filter 317 and the second color filter 318 disposed on the first color filter 317 are disposed in the circuit area of each sub-pixel in the non-emission area NEA, so that it may be possible to prevent light from being incident on the channel areas of the first to third active layers 331, 332, and 333.

Accordingly, it may be possible to prevent characteristics of the first to third transistors T1, T2, and T3 from being changed by the light.

FIGS. 3 and 4 show a structure where the first to fourth signal lines 311, 312, 313, and 314 are disposed on the same layer as the first to third active layers 331, 332, and 333, but the structure of the organic light emitting display device according to embodiments of the disclosure is not limited thereto.

Figure 5:
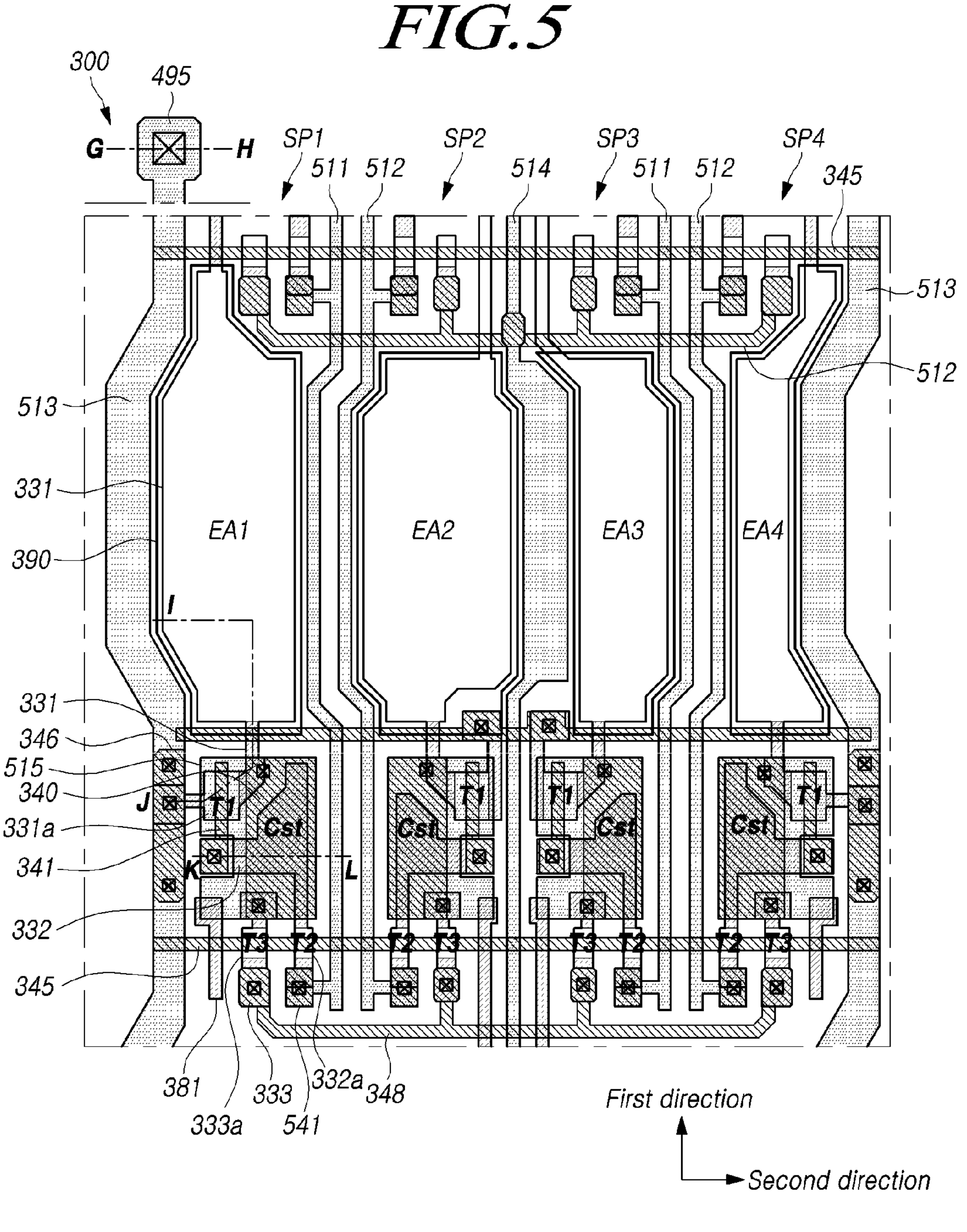
FIG. 5 is a top plan view of a plurality of sub-pixel areas of the organic light emitting display device according to embodiments of the disclosure.
Figure 6:
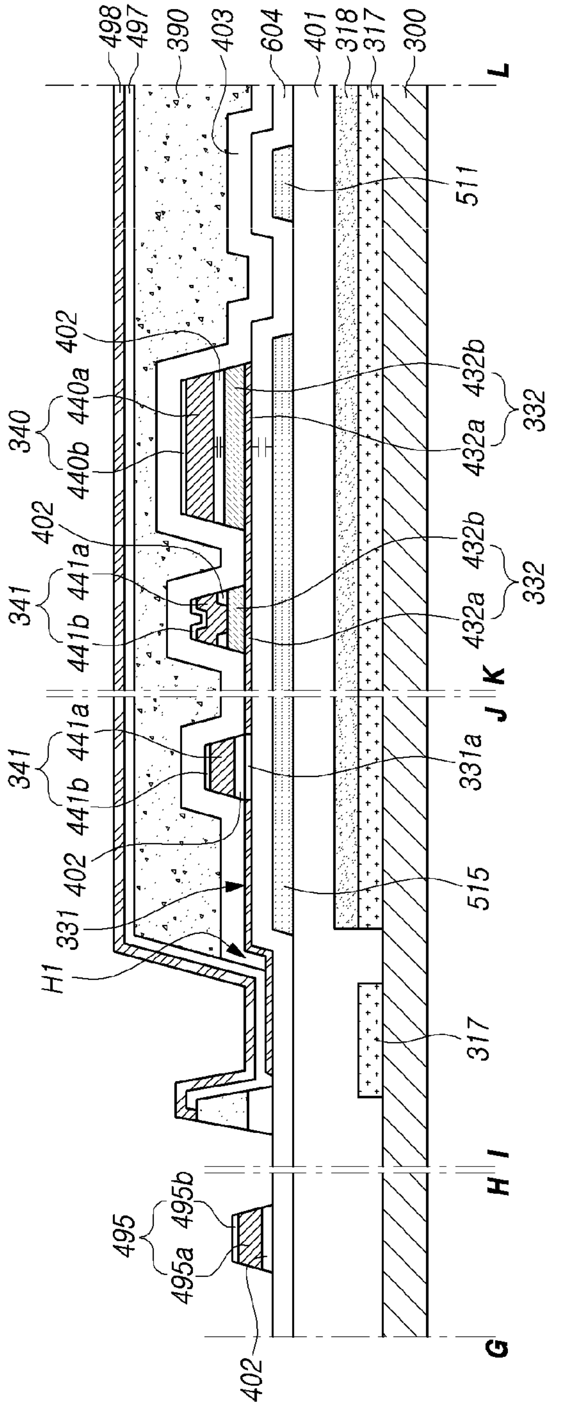
FIG. 6 is a cross-sectional view taken along the lines G-H, I-J, and K-L in FIG. 5.

FIG. 5 is a top plan view of a plurality of sub-pixel areas of an organic light emitting display device according to embodiments of the disclosure. FIG. 6 is a cross-sectional view taken along the lines G-H, I-J, and K-L in FIG. 5.

In the following description, a feature, an effect, etc., that has been described in the above-mentioned embodiments may not be repeatedly described. In addition, the same drawing reference number may be used when a feature described above is repeatedly described in the following description.

Referring to FIGS. 5 and 6, a plurality of color filters 317 and 318 may be disposed on a substrate 300.

Although not shown in FIGS. 5 and 6, at least one buffer layer may be disposed between the substrate 300 and the plurality of color filters 317 and 318.

A first insulating layer 401 may be disposed on the substrate 300 on which the first and second color filters 317 and 318 are disposed.

Referring to FIGS. 5 and 6, first, second, third and fourth signal lines 511, 512, 513, and 514 and a light blocking layer 515 may be disposed on the first insulating layer 401.

The first to fourth signal lines 511, 512, 513, and 514 and the light blocking layer 515 on the first insulating layer 401 may include any one of metals such as aluminum (Al), gold (Au), silver (Ag), copper (Cu), tungsten (W), molybdenum (Mo), chromium (Cr), tantalum (Ta), and titanium (Ti) or alloys thereof. For example, a metal layer may be an alloy of molybdenum (Mo) and titanium (Ti), but the disclosure is not limited thereto.

The light blocking layer 515 may be disposed in a circuit area of each of sub-pixels SP1, SP2, SP3, and SP4. Preferably, the light blocking layer 515 may disposed in the non-emission area NEA and overlaps a portion of the first active layer 331 and a portion of each of the second active layer 332 and a third active layer 333 that are spaced apart from the first active layer 331.

As shown in FIG. 6, a fourth insulating layer 604 may be disposed on the substrate 300 on which the first to fourth signal lines 511, 512, 513, and 514 and the light blocking layer 515 are disposed.

The fourth insulating layer 604 may include an inorganic insulating material such as silicon oxide (SiOx), silicon nitride (SiNx), or silicon oxynitride (SiON), but embodiments of the disclosure are not limited thereto.

Referring to FIGS. 5 and 6, first to third active layers 331, 332, and 333 and a repair pattern 381 may be disposed on the fourth insulating layer 604.

Each of the first to third active layers 331, 332, and 333 may be formed as a double layer in an area in contact with other components through a contact hole.

In other words, each of the first to third active layers 331, 332, and 333 may include a first active pattern and a second active pattern disposed on the first active pattern in the area in contact with other components through the contact hole.

For example, the second active layer 332 may include the first active pattern 432*a* and the second active pattern 432*b* in an area where it is in contact with a plate 340 through the contact hole.

In addition, as shown in FIG. 6, the second active layer 332 may be in contact with an electrode pattern 341 through the contact hole, and may include the first active pattern 432*a* and the second active pattern 432*b* disposed on the first active pattern 432*a* in an area where it overlaps the plate 340 to form a storage capacitor Cst.

Although not shown in FIG. 6, the third active layer 333 may include the first active pattern and the second active pattern disposed on the first active pattern in an area in contact with the plate 340 and a second extension 348.

The areas in which the first to third active layers 331, 332, and 333 are connected to other components through the contact holes may serve as source and drain electrodes of first to third transistors T1, T2, and T3.

Taking a first sub-pixel SP1 as an example, as shown in FIG. 5, a portion of the first active layer 331 may be in contact with a first extension 346 connected to a third signal line 515 through the contact hole. Another portion of the first active layer 331 may be connected to the plate 340 through the contact hole.

A portion of the second active layer 332 may be connected to a first electrode pattern 341 through the contact hole. Another portion of the second active layer 332 may be connected to a second electrode pattern 541 and a first signal line 511 disposed on the same layer as the first electrode pattern 341 through the contact hole.

A portion of the third active layer 333 may be connected to the plate 340 through the contact hole. Another portion of the third active layer 333 may be connected to the second extension 348.

A second insulating layer 402, a fifth signal line 345, the first extension 346, the second extension 348, the plate 340, the first electrode pattern 341, and the second electrode pattern 541 may be disposed on the substrate on which the first to third active layers 331, 332, 333 and the repair pattern 381 are disposed.

A third insulating layer 403 including a first hole H1 and a bank 390 may be sequentially disposed on the substrate 300 on which the fifth signal line 345, the first extension 346, the second extension 348, the plate 340, the first electrode pattern 341, and the second electrode pattern 541 are disposed.

As shown in FIG. 5, the bank 390 may not overlap at least one end of the first active layer 331 positioned in emission areas EA1, EA2, EA3, and EA4.

In other words, referring to FIG. 6, an opening of the bank 390 may overlap at least one side surface of the first active layer 331.

An organic layer 497 and a second electrode 498 may be sequentially disposed on upper and side surfaces of the bank 390 and in the opening of the bank 390.

Referring to FIGS. 5 and 6, at least a portion of the opening of the bank 390 may correspond to the emission areas EA1, EA2, EA3, and EA4.

As mentioned above, the opening of the bank 390 may overlap at least one side surface of the first active layer 331. Therefore, the bank 390 may cover an upper surface of the first active layer 331 serving as a first electrode of an organic light emitting element OLED in a smaller area, thereby increasing the area of each of the emission areas EA1, EA2, EA3, and EA4.

As described with reference to FIGS. 3 to 6, the color filters may be disposed not only in the emission areas EA1, EA2, EA3, and EA4 but also in a non-emission area NEA in the organic light emitting display device according to embodiments of the disclosure, so that it may be possible to improve visibility by absorbing external light or light from light leaking components inside a panel.

This will be reviewed in detail as below with reference to FIGS. 7 and 8.

Figure 7:
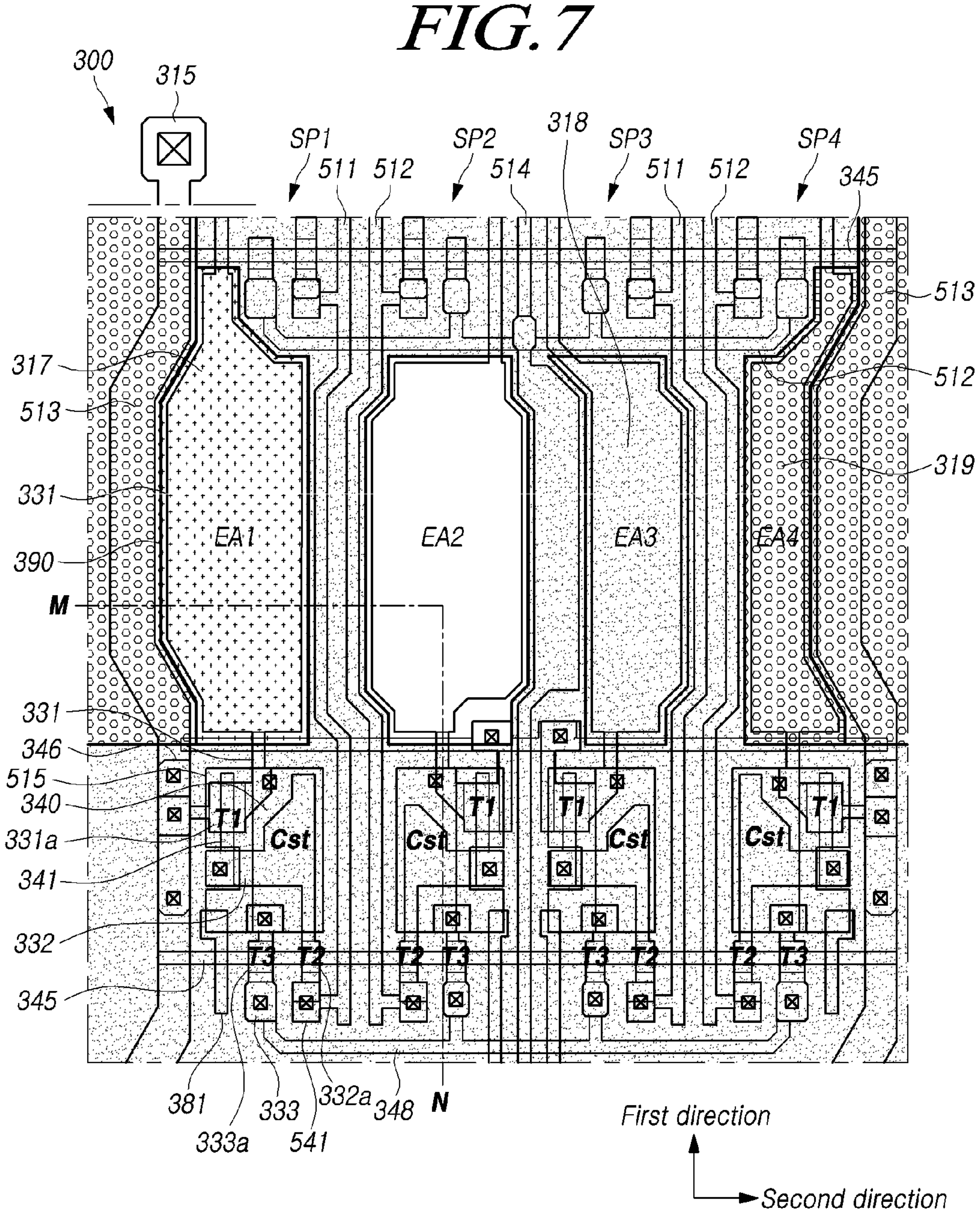
FIG. 7 is a top plan view illustrating color filters disposed in the structure in FIG. 5.

FIG. 7 is a top plan view illustrating color filters disposed in the structure in FIG. 5. FIG. 8 is a schematic view of a cross-sectional structure taken along the line M-N in FIG. 7.

In the following description, a feature, an effect, etc., that has been described in the above-mentioned embodiments may not be repeatedly described. In addition, the same drawing reference number may be used when a feature described above is repeatedly described in the following description.

Figure 8:
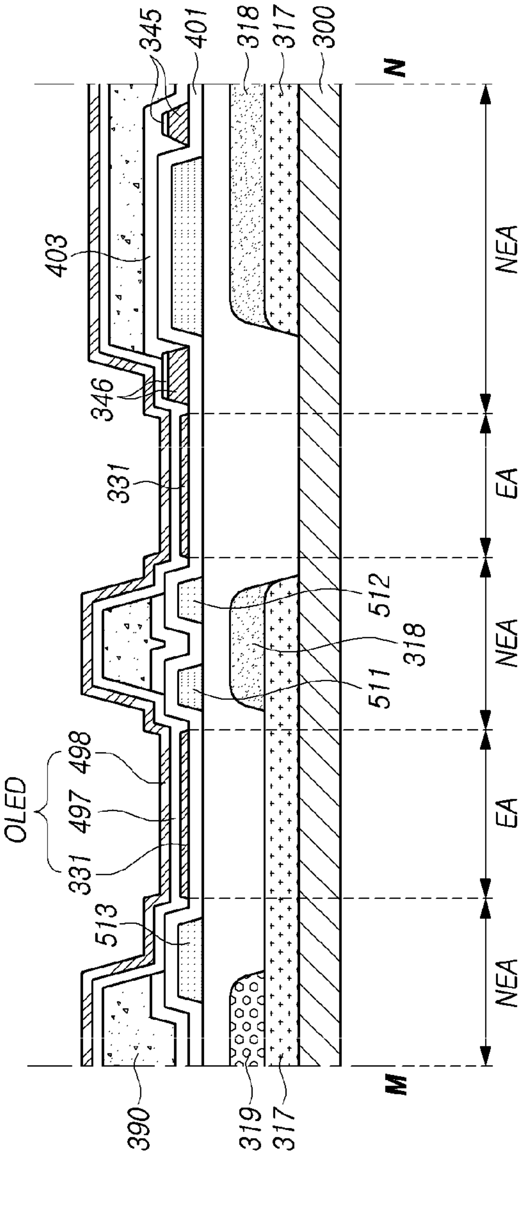
FIG. 8 is a schematic view of a cross-sectional structure taken along the line M-N in FIG. 7.

Referring to FIGS. 7 and 8, a first color filter 317 may be disposed in a first sub-pixel SP1 to overlap a first emission area EA1, a second color filter 318 may be disposed in a third sub-pixel SP3 to overlap a third emission area EA3, and a third color filter 319 may be disposed in a fourth sub-pixel SP4 to overlap a fourth emission area EA4.

No color filter may be disposed in a second emission area EA2.

Each of first to fourth signal lines 511, 512, 513, and 514 and a circuit area disposed in a non-emission area NEA may overlap at least two color filters of different colors.

As shown in FIG. 7, the first to fourth signal lines 511, 512, 513, and 514 may overlap the red first color filter 317 and the blue second color filter 318 disposed on the first color filter 317, or may overlap the first color filter 317 and the green third color filter 319 disposed on the first color filter 317.

For example, the first and second signal lines 511 and 512 may overlap the first and second color filters 317 and 318, and the third and fourth signal lines 513 and 514 may overlap the first and third color filters 317 and 319. In addition, the circuit area of each of the sub-pixels SP1, SP2, SP3, and SP4 may overlap the first and second color filters 317 and 318.

The color filters overlapping different colors may absorb light.

Therefore, when light emitted from an organic light emitting element OLED is emitted in a direction toward a substrate 300, it may possible to prevent the light from being absorbed and thus passed to another sub-pixel in the case that the light reaches an area where the first and second color filters 317 and 318 or the first and third color filters 317 and 319 disposed on the substrate are stacked.

Accordingly, it may be possible to prevent light leakage from occurring due to the light passing to another sub-pixel emitting a different color.

Furthermore, as described with reference to FIGS. 5 and 6, a bank 390 may be disposed to expose some of electrodes or signal lines disposed in the non-emission area NEA. For example, as shown in FIG. 8, the bank 390 may not overlap a portion of a first extension 346.

That is, an opening of the bank 390 may be disposed so as to overlap the portion of the first extension 346, so that an area in which the bank 390 covers a first active layer 331 serving as a first electrode of the organic light emitting element OLED may be minimized or reduced to increase the emission areas.

The structures in FIGS. 5 and 6 have been taken as an example to describe the structures in FIGS. 7 and 8 where the first to third color filters 317, 318, and 319 are disposed in the emission areas EA1, EA2, EA3, and EA4 and the non-emission area NEA, but the first to third color filters 317, 318, and 319 in FIGS. 7 and 8 may also be applied to the structures in FIGS. 3 and 4.

The steps of manufacturing an organic light emitting display device according to embodiments of the disclosure will be briefly reviewed as follows with reference to FIGS. 9 to 12.

FIGS. 9 to 12 are views schematically illustrating the steps of manufacturing the organic light emitting display device according to embodiments of the disclosure.

In the following description, a feature, an effect, etc., that has been described in the above-mentioned embodiments may not be repeatedly described. In addition, the same drawing reference number may be used when a feature described above is repeatedly described in the following description.

For convenience of description, it is assumed that the organic light emitting display device described with reference to FIGS. 9 to 12 includes the structures in FIGS. 7 and 8.

Figure 9:
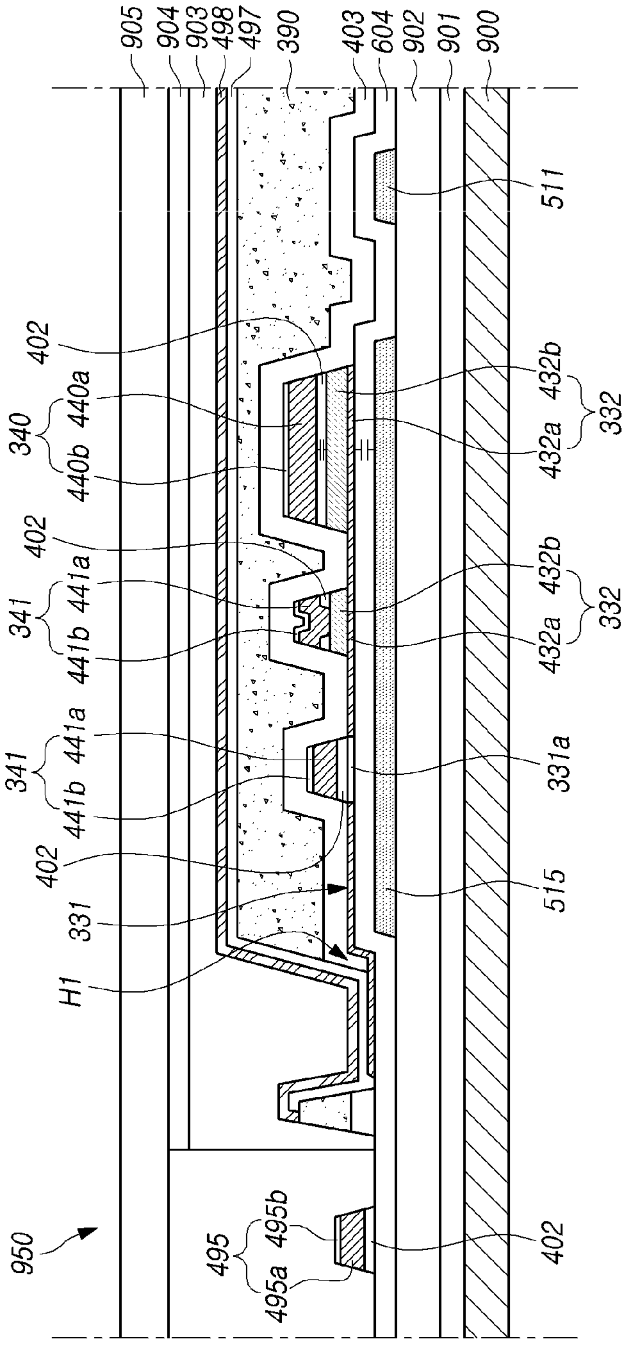
FIGS. 9 to 12 are views schematically illustrating the steps of manufacturing the organic light emitting display device according to embodiments of the disclosure.

Referring to FIG. 9, the organic light emitting display device according to embodiments of the disclosure may include a first portion 950 and a second portion 1050.

The first portion 950 may include a first support substrate 900, a first sacrificial layer 901 disposed on the first support substrate 900, and a buffer layer 902 disposed on the first sacrificial layer 901.

A light blocking layer 515 and a plurality of signal lines including a first signal line 511 may be disposed on the buffer layer 902.

A fourth insulating layer 604 may be disposed on the light blocking layer 515 and the first signal line 511.

A plurality of active layers 331 and 332 may be disposed on the fourth insulating layer 604.

A second insulating layer 402 may be disposed on the plurality of active layers 331 and 332.

A plate 340 and an electrode pattern 341 may be disposed on the second insulating layer 402, and a pad electrode 495 may be disposed in a pad area PAD.

A third insulating layer 403 may be disposed on the plate 340 and the electrode pattern 341, and a bank 390 may be disposed on the third insulating layer 403.

An organic layer 497 and a second electrode 498 may be disposed on the bank 390 and a portion of an upper surface of a first active layer 331.

An encapsulation layer 903 may be disposed on the second electrode 498.

Although FIG. 9 illustrates a structure in which the encapsulation layer 903 is formed as a single layer, the structure of the organic light emitting display device according to embodiments of the disclosure is not limited thereto, and may be a multiple-layered structure in which an inorganic film and an organic film are alternately arranged.

A second sacrificial layer 904 and a second support substrate 905 may be sequentially disposed on the encapsulation layer 903.

Figure 10:
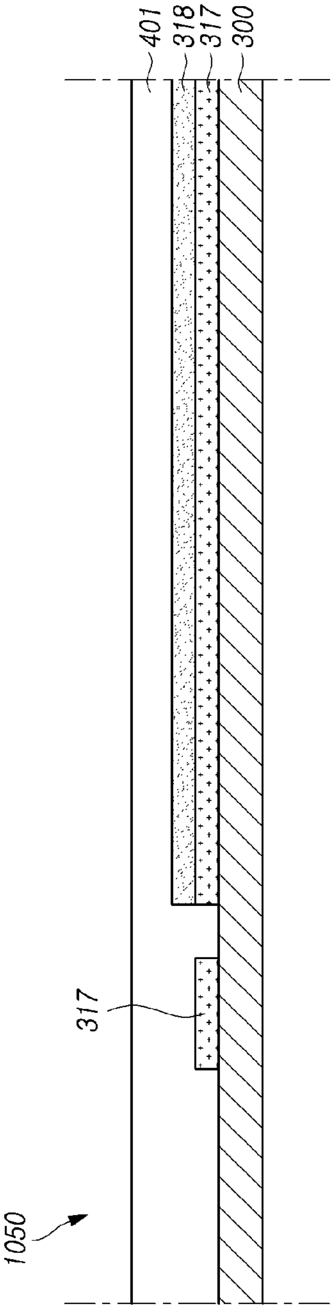

As shown in FIG. 10, the second portion 1050 may include a plurality of color filters 317 and 318 disposed on a substrate 300 and a first insulating layer 401 disposed on the plurality of color filters 317 and 318.

Figure 11:
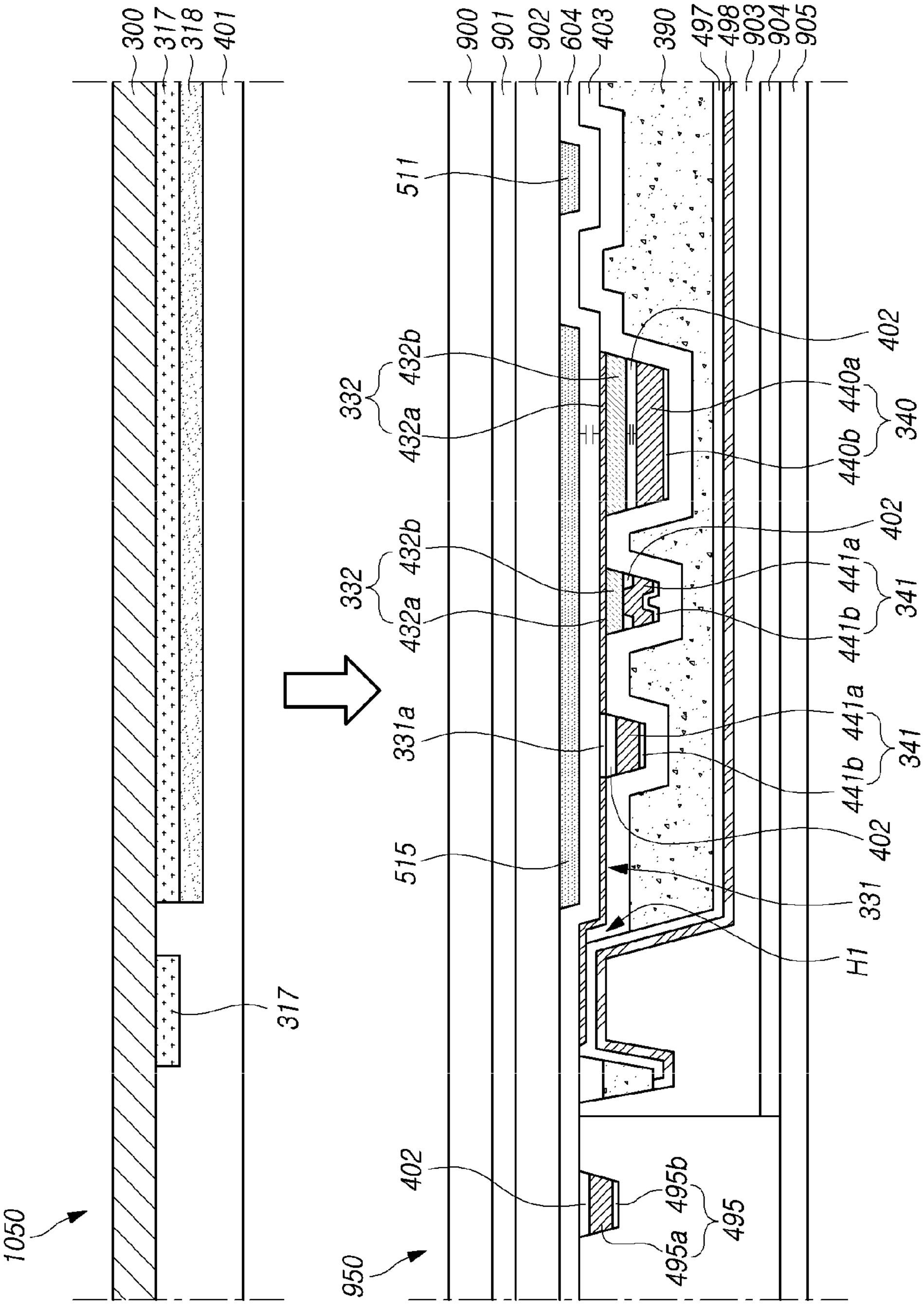
Figure 12:
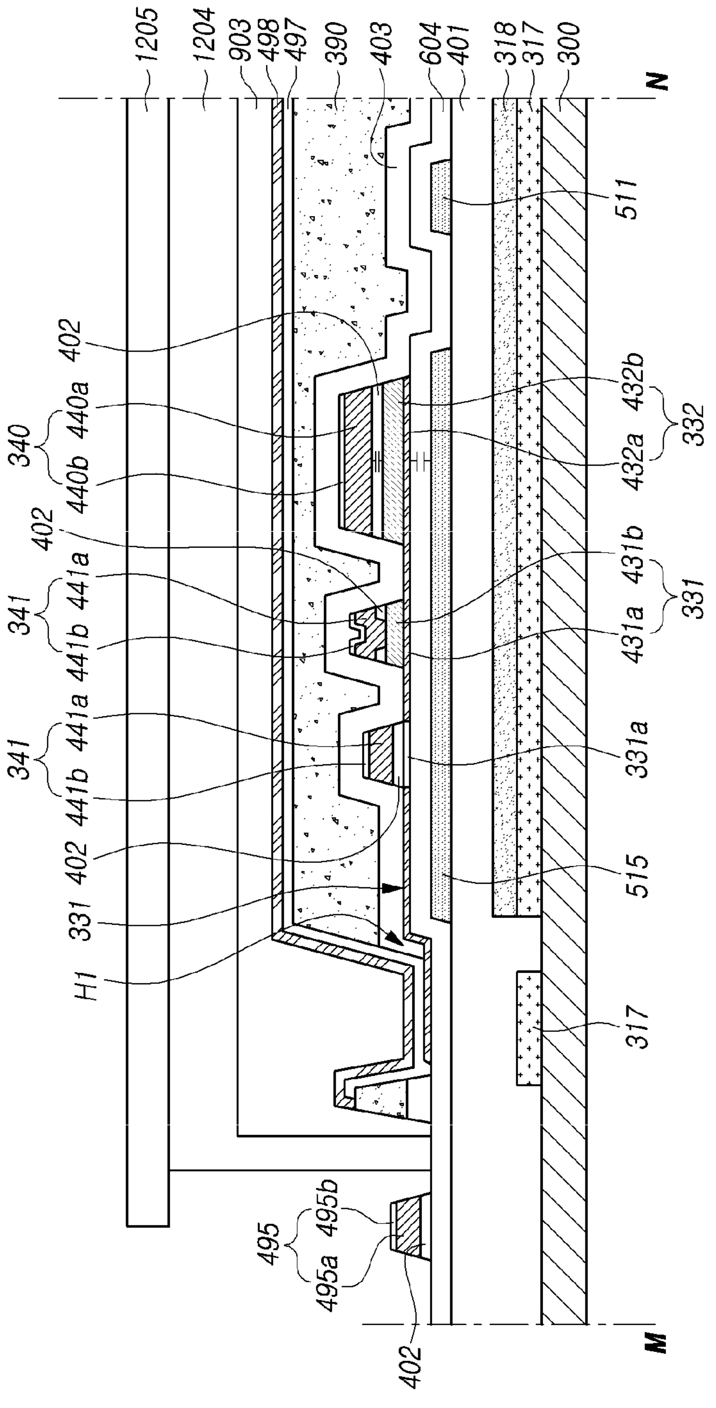

As shown in FIGS. 11 and 12, thereafter, the first support substrate 900 and the first sacrificial layer 901 of the first portion 950 may be removed, and an upper surface of the first insulating layer 401 of the second portion 1050 may be attached to one surface of the buffer layer 902.

After the first insulating layer 401 and the buffer layer 902 are attached to each other, an encapsulation substrate 1205 may be disposed on the encapsulation layer 903. The encapsulation substrate 1205 may be adhered to the encapsulation layer 903 through an adhesive layer 1204.

The adhesive layer 1204 may include a component absorbing moisture.

According to the embodiments of the disclosure, there may be provided the organic light emitting display device and the organic light emitting display panel, wherein at least one of the plurality of active layers disposed in the circuit area is extended to the emission area so that the active layer serves as the anode electrode of the organic light emitting element and the plurality of active layers are disposed on the same layer as the plurality of signal lines, thereby simplifying the process.

According to the embodiments of the disclosure, there may be provided the organic light emitting display device and the organic light emitting display panel, wherein the bank is disposed to expose at least the portion of the side surface of the anode electrode of the organic light emitting element, thereby improving the opening ratio.

The description above has been presented to enable any person skilled in the art to make and use the technical idea of the present disclosure, and has been provided in the context of a particular application and its benefits. Various modifications, additions and substitutions to the described embodiments will be readily apparent to those skilled in the art, and the general principles described herein may be applied to other embodiments and applications without departing from the spirit and scope of the present disclosure. The description above and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting display device comprising:

a substrate;

an emission area on the substrate;

a non-emission area adjacent to the emission area on the substrate;

a plurality of color filters disposed on the substrate;

a first color filter of the plurality overlapping the emission area;

a second color filter of the plurality overlapping the non-emission area;

a first insulating layer disposed on the plurality of color filters;

a first active layer disposed on the first insulating layer;

a gate electrode disposed on an upper surface of the first active layer;

a second insulating layer disposed on the first active layer and the gate electrode;

a hole in the second insulation layer that exposes a portion of the upper surface of the first active layer;

a bank disposed on the second insulating layer;

an opening in the bank that overlaps the hole;

an organic layer disposed on the portion of the upper surface of the first active layer and on the bank; and a cathode electrode disposed on the organic layer,
wherein the first active layer comprises:
a first active pattern including a transparent conductive material; and
a second active pattern disposed on a portion of an upper surface of the first active pattern and including a metal material.

2. The organic light emitting display device of claim 1, wherein the first color filter is a single layer and the second color filter includes multiple layers, the multiple layers including a stack of layers, the layers being associated with different colors.

3. The organic light emitting display device of claim 2, further comprising a plurality of signal lines, wherein the second color filter overlaps a circuit area and the plurality of signal lines.

4. The organic light emitting display device of claim 1, wherein the second active pattern is not disposed in an area overlapping the gate electrode and is not disposed in an area overlapping the opening of the bank.

5. The organic light emitting display device of claim 4, wherein the first active pattern disposed in the area overlapping the opening of the bank is in a conductive state and the first active pattern disposed in the area overlapping the gate electrode is in a non-conductive state.

6. The organic light emitting display device of claim 1, further comprising:
a second active layer spaced apart from the first active layer; and
a plate disposed on the second active layer;
wherein the second active layer includes:
a first active pattern having the transparent conductive material; and
a second active pattern disposed on the first active pattern of the second active layer and having the metal material in an area overlapping the plate.

7. The organic light emitting display device of claim 6, wherein the plate and the second active pattern are electrodes of a storage capacitor.

8. The organic light emitting display device of claim 1, further comprising:
a plurality of signal lines disposed in the non-emission area, extending in a substantially vertical direction, and spaced apart from one another, wherein the signal lines are disposed on the same layer as the first active layer and include the same material as the first active layer.

9. The organic light emitting display device of claim 8, wherein the plurality of signal lines comprises a first active pattern including the transparent conductive material and a second active pattern disposed on the first active pattern of the plurality of signal lines and including the metal material.

10. The organic light emitting display device of claim 1, further comprising a light blocking layer including a metal material and disposed between the first insulating layer and the first active layer.

11. The organic light emitting display device of claim 10, wherein the light blocking layer is disposed in the non-emission area, and the light blocking layer overlaps a portion of the first active layer and a portion of each of the second active layer and a third active layer that are spaced apart from the first active layer.

12. The organic light emitting display device of claim 11, wherein the second active layer comprises a first active pattern including the transparent conductive material, and a second active pattern disposed on the first active pattern of the second active layer and including the metal material, the first and second active patterns of the second active layer being in an area overlapping the light blocking layer.

13. The organic light emitting display device of claim 12, further comprising a plate disposed on the second active layer, wherein the second active layer, and the plate are the electrodes of a storage capacitor.

14. The organic light emitting display device of claim 11, further comprising a plurality of signal lines disposed in the non-emission area, extending in the vertical direction, and spaced apart from one another, wherein the plurality of signal lines are disposed on the same layer as the light blocking layer and comprise the same material as the light blocking layer.

15. The organic light emitting display device of claim 1, further comprising a driving transistor including the first active layer and the gate electrode.

16. An organic light emitting display panel, comprising:
a substrate;
a plurality of color filters disposed on the substrate and overlapping an emission area;
a first insulating layer disposed on the plurality of color filters;
a first active layer disposed on the first insulating layer;
a gate electrode disposed on an upper surface of the first active layer;
a second insulating layer disposed on the first active layer and the gate electrode;
a hole in the second insulating layer that exposes a portion of the upper surface of the first active layer;
a bank disposed on the second insulating layer;
an opening in the bank that overlaps the hole;
an organic layer disposed on the portion of the upper surface of the first active layer and on the bank; and
a cathode electrode disposed on the organic layer-,
wherein the first active layer comprises:
a first active pattern including a transparent conductive material; and
a second active pattern disposed on a portion of an upper surface of the first active pattern and including a metal material.

17. A display panel, comprising:
a substrate;
an emission area on the substrate;
a non-emission area adjacent the emission area;
a plurality of color filters disposed on the substrate and overlapping an emission area;
a first insulating layer disposed on the plurality of color filters;
a first active layer extending continuously from the emission area into the non-emission area;
a driving transistor including:
a channel area of the first active layer in the non-emission area;
a gate electrode overlapping the channel area; and
a second insulating layer between the gate electrode and the channel area; and
a light emitting element including:
a first electrode in the first active layer in the emission area;
an organic layer on the first electrode; and
a second electrode on the organic layer.

18. The display panel of claim 17, further comprising:
a second active layer on the same layer as the first active layer and spaced apart from the first active layer; and
a storage capacitor including:
a first electrode in the second active layer;
a second electrode that overlaps the first electrode; and an insulating layer between the first electrode and the second electrode.

19. The display panel of claim 17, further comprising:

a third insulating layer on the gate electrode and the first active layer; and a bank on the third insulating layer;

wherein the organic layer is on sidewalls of the third insulating layer and the bank.

* * * * *